(12) United States Patent
Kozlowski et al.

(10) Patent No.: US 11,259,398 B2
(45) Date of Patent: Feb. 22, 2022

(54) ELECTRICAL CIRCUIT BOARD WITH LOW THERMAL CONDUCTIVITY AND METHOD OF CONSTRUCTING THEREOF

(71) Applicants: Magna Seating Inc, Aurora (CA); Eric Kozlowski, Oakland Township, MI (US); Jason Davis, Commerce Township, MI (US); Larry Peters, Jr., Fowlerville, MI (US)

(72) Inventors: Eric Kozlowski, Oakland Township, MI (US); Jason Davis, Commerce Township, MI (US); Larry Peters, Jr., Fowlerville, MI (US)

(73) Assignee: Magna Seating Inc., Aurora (CA)

(*) Notice: Subject to any disclaimer, the term of this patent is extended or adjusted under 35 U.S.C. 154(b) by 136 days.

(21) Appl. No.: 16/499,555

(22) PCT Filed: Mar. 30, 2018

(86) PCT No.: PCT/US2018/025317
§ 371 (c)(1),
(2) Date: Sep. 30, 2019

(87) PCT Pub. No.: WO2018/183787
PCT Pub. Date: Oct. 4, 2018

(65) Prior Publication Data
US 2021/0105889 A1    Apr. 8, 2021

Related U.S. Application Data

(60) Provisional application No. 62/479,452, filed on Mar. 31, 2017.

(51) Int. Cl.
*H05K 1/00* (2006.01)
*H05K 1/02* (2006.01)
(Continued)

(52) U.S. Cl.
CPC ........... *H05K 1/0201* (2013.01); *H05K 1/038* (2013.01); *H05K 1/09* (2013.01);
(Continued)

(58) Field of Classification Search
CPC .. H05K 1/00; H05K 1/02; H05K 1/03; H05K 1/09; H05K 1/11; H05K 1/16; H05K 1/18;
(Continued)

(56) References Cited

U.S. PATENT DOCUMENTS 4,357,386 A * 11/1982 Luciano .................... B32B 5/06
442/30
4,569,883 A * 2/1986 Renjilian .............. D21F 1/0027
442/194
(Continued)

FOREIGN PATENT DOCUMENTS

EP         0440918        8/1997
JP         H05175649      7/1993
(Continued)

OTHER PUBLICATIONS

Don Tuite, "A Quick Tutorial ON PCB's", Electronic Design, Apr. 16, 2015, Retrieved from the Internet: URL:http://www.electronicdesigns.com/print/59136 [retreived on Jul. 12, 2018].

*Primary Examiner* — Xiaoliang Chen
(74) *Attorney, Agent, or Firm* — Miller Canfield

(57) ABSTRACT

An electrical circuit board includes a first conductive layer and a second conductive layer. And an interlayer forming a thermal barrier is placed between the first conductive layer and the second conductive layer, wherein the thermal barrier reduces heat transfer between the first conductive layer and the second conductive layer.

17 Claims, 6 Drawing Sheets

(51) Int. Cl.

| | | |
|---|---|---|
| *H05K 1/03* | (2006.01) | |
| *H05K 1/09* | (2006.01) | |
| *H05K 1/11* | (2006.01) | |
| *H05K 1/16* | (2006.01) | |
| *H05K 1/18* | (2006.01) | |
| *H05K 3/30* | (2006.01) | |
| *H05K 3/38* | (2006.01) | |
| *H05K 3/40* | (2006.01) | |
| *H05K 3/46* | (2006.01) | |
| *B32B 27/04* | (2006.01) | |
| *B32B 27/08* | (2006.01) | |
| *B32B 27/30* | (2006.01) | |
| *B32B 27/36* | (2006.01) | |
| *B32B 27/38* | (2006.01) | |
| *B32B 37/02* | (2006.01) | |

(52) U.S. Cl.
CPC .......... *H05K 2201/0116* (2013.01); *H05K 2201/029* (2013.01); *H05K 2201/0355* (2013.01); *H05K 2201/062* (2013.01)

(58) Field of Classification Search
CPC .. H05K 3/30; H05K 3/38; H05K 3/40; H05K 3/46
USPC .... 174/255, 251, 259; 442/35, 59, 123, 131, 442/136, 180.197, 352, 381, 392, 180, 442/197; 428/35.2, 95, 96, 102, 195.1, 428/209, 213, 218, 219, 315.7, 411.1, 4, 428/13, 414, 416, 921; 165/325; 156/325
See application file for complete search history.

(56) References Cited

U.S. PATENT DOCUMENTS

| | | | | |
|---|---|---|---|---|
| 4,571,359 | A * | 2/1986 | Dutt | D21F 7/083 442/324 |
| 4,657,806 | A * | 4/1987 | Dutt | D21F 1/0063 442/76 |
| 4,686,135 | A * | 8/1987 | Obayashi | B32B 25/08 442/94 |
| 4,964,948 | A | 10/1990 | Reed | |
| 5,126,192 | A | 6/1992 | Chellis et al. | |
| 5,142,448 | A | 8/1992 | Kober et al. | |
| 5,323,815 | A * | 6/1994 | Barbeau | D03D 15/513 139/420 A |
| 5,450,182 | A * | 9/1995 | Wayman | G03G 15/2064 399/328 |
| 5,492,741 | A * | 2/1996 | Akao | B32B 5/18 428/35.2 |
| 5,812,375 | A | 9/1998 | Casperson | |
| 5,854,325 | A * | 12/1998 | Hosomi | C09J 163/00 524/425 |
| 6,344,254 | B1 * | 2/2002 | Smith | B32B 5/26 428/95 |
| 8,084,086 | B2 * | 12/2011 | Hass | C23C 14/0021 427/248.1 |
| 8,129,450 | B2 * | 3/2012 | Wood | B32B 15/08 524/48 |
| 8,312,827 | B1 * | 11/2012 | Free | D05C 17/00 112/475.08 |
| 8,355,254 | B2 | 1/2013 | Oota | |
| 8,430,987 | B2 * | 4/2013 | Simons | G06K 19/027 156/247 |
| 9,825,345 | B2 * | 11/2017 | Liu | H01M 10/623 |
| 10,000,622 | B2 * | 6/2018 | Kumano | C08G 63/00 |
| 10,052,066 | B2 * | 8/2018 | Rogers | A61B 5/7455 |
| 10,158,102 | B2 * | 12/2018 | Wu | H01M 50/3425 |
| 10,357,201 | B2 * | 7/2019 | Rogers | A61B 42/10 |
| 2002/0045394 | A1 * | 4/2002 | Noda | B32B 7/12 442/180 |
| 2003/0060107 | A1 * | 3/2003 | Gooliak | B32B 15/02 442/131 |
| 2003/0226612 | A1 * | 12/2003 | Zhu | D03D 15/00 139/407 |
| 2003/0228821 | A1 * | 12/2003 | Zhu | D03D 1/0041 442/197 |
| 2004/0065072 | A1 * | 4/2004 | Zhu | D02G 3/28 57/314 |
| 2004/0132372 | A1 | 7/2004 | Samuela et al. | |
| 2004/0142155 | A1 * | 7/2004 | Yokota | H05K 1/036 428/209 |
| 2004/0266293 | A1 * | 12/2004 | Thiriot | A41D 31/085 442/59 |
| 2005/0120715 | A1 * | 6/2005 | Labrador | F02C 1/05 60/618 |
| 2005/0170732 | A1 * | 8/2005 | Knoff | B32B 5/32 442/381 |
| 2005/0215142 | A1 * | 9/2005 | Bascom | B32B 5/022 442/35 |
| 2006/0135023 | A1 * | 6/2006 | Knoff | B32B 5/06 442/392 |
| 2006/0145009 | A1 * | 7/2006 | Shockey | B32B 5/022 244/121 |
| 2006/0204652 | A1 | 9/2006 | Meier | |
| 2007/0026752 | A1 * | 2/2007 | Thiriot | A41D 31/085 442/217 |
| 2007/0169886 | A1 * | 7/2007 | Watanabe | H05K 1/036 156/325 |
| 2008/0121416 | A1 * | 5/2008 | Hirai | H05K 3/4614 174/259 |
| 2008/0199681 | A1 * | 8/2008 | Murphy | C23C 18/1204 428/312.8 |
| 2009/0229862 | A1 * | 9/2009 | Nakamura | H05K 3/462 174/251 |
| 2009/0274184 | A1 * | 11/2009 | Ikeda | G11B 7/12 372/36 |
| 2011/0070410 | A1 * | 3/2011 | Huang | B32B 21/10 428/195.1 |
| 2012/0082853 | A1 * | 4/2012 | Maeda | C08G 18/12 428/416 |
| 2012/0160166 | A1 * | 6/2012 | Hass | C23C 14/08 118/719 |
| 2013/0233329 | A1 * | 9/2013 | Sebastian | A24D 1/22 131/329 |
| 2014/0008104 | A1 * | 1/2014 | Sugaya | H05K 3/303 174/251 |
| 2015/0168614 | A1 * | 6/2015 | Running | G02B 5/124 359/530 |
| 2016/0284906 | A1 * | 9/2016 | Weigel | B32B 27/283 |
| 2017/0181294 | A1 | 6/2017 | Hayashi et al. | |
| 2019/0284734 | A1 * | 9/2019 | Huang | D01F 6/06 |

FOREIGN PATENT DOCUMENTS

| | | |
|---|---|---|
| JP | 2011046083 | 3/2011 |
| JP | 2014146843 | 8/2014 |

* cited by examiner

ELECTRICAL CIRCUIT BOARD WITH LOW THERMAL CONDUCTIVITY AND METHOD OF CONSTRUCTING THEREOF

CROSS-REFERENCE TO RELATED APPLICATIONS

This application claims priority to U.S. provisional patent application No. 62/479,452, filed Mar. 31, 2017, which is incorporated herein by reference.

FIELD OF THE INVENTION

The present application generally relates to electrical circuit boards and specifically to electrical circuit boards with low thermal conductivity. The present application also generally relates to methods of constructing electrical circuit boards with low thermal conductivity.

BACKGROUND

A typical FR4 electrical circuit board ("ECB") includes an FR4 interlayer between two conductive layers. The two conductive layers may be two copper foils. FR4 is a flame resistant composite material and the FR4 interlayer functions as an electrical insulator. The FR4 interlayer is made of glass fiber fabric with an epoxy resin binder. FR4 incorporates 8 layers of glass fiber material. A FR4 ECB is constructed to withstand any thermal shock that may occur in an electrified application. In an example, one or more FR4 interlayers are bonded between two conductive layers to form an ECB with a desired thickness. A conductive layer, such as copper foil, is laminated to one or both sides of the interlayers under vacuum conditions, with a predetermined cure temperature and pressure.

The FR4 interlayer is designed to conduct heat away from active electrical elements mounted on one conductive layer of an ECB to the opposite conductive layer. Therefore, high thermal conductivity is desired for an FR4 ECB. The thermal conductivity value of a commercially available FR4 ECB typically is 0.3-0.4 W/mK.

Sometimes, heat producing electronic elements or circuits, such as processors and resistors, are mounted on one conductive layer of an ECB, while heat sensitive electronic elements or circuits, such as temperature sensors or heat sensors, are mounted on the opposite conductive layer of the ECB. The FR4 interlayer conducts heat from the conductive layer mounted with the heat producing electronic elements or circuits to the opposite conductive layer mounted with the heat sensitive electronic elements or circuits. The heat transferred by the FR4 interlayer can thermally affect the performance of heat sensitive electrical elements or circuits on the opposite conductive layer.

SUMMARY OF THE INVENTION

To ensure heat sensitive electrical elements or circuits mounted on a conductive layer function properly, a low thermal conductivity ECB is desired to prevent or reduce heat transfer from the opposite conductive layer mounted with the heat producing electronic elements or circuits to the conductive layer mounted with the heat sensitive electronic elements or circuits.

Conductive layers of an ECB may be thermally isolated from each other by including thermal barriers in one or more interlayers between two conductive layers. The thermal barrier may include one or more interlayers made of thermally insulating materials, one or more interlayers containing air bubbles, such as microbubbles, therein, or a combination thereof.

According to an embodiment, there is provided an electrical circuit board, which comprises:
a first conductive layer and a second conductive layer; and
an interlayer as a thermal barrier, placed between the first conductive layer and the second conductive layer, wherein the thermal barrier reduces heat transfer between the first conductive layer and the second conductive layer.

According to another embodiment, there is provided a method of constructing an electrical circuit board, which comprises:
forming a stack of layers comprising first and second conductive layers, at least one interlayer placed between the first and second conductive layers; and
constructing an electrical circuit board by applying a laminating process on the stack of layers under an atmospheric pressure.

BRIEF DESCRIPTION OF THE DRAWINGS

Reference will now be made, by way of example, to the accompanying drawings which show example embodiments of the present invention, and in which.

Similar reference numerals may have been used in different figures to denote similar components.

DETAILED DESCRIPTION OF THE PREFERRED EMBODIMENTS

Figure 1:
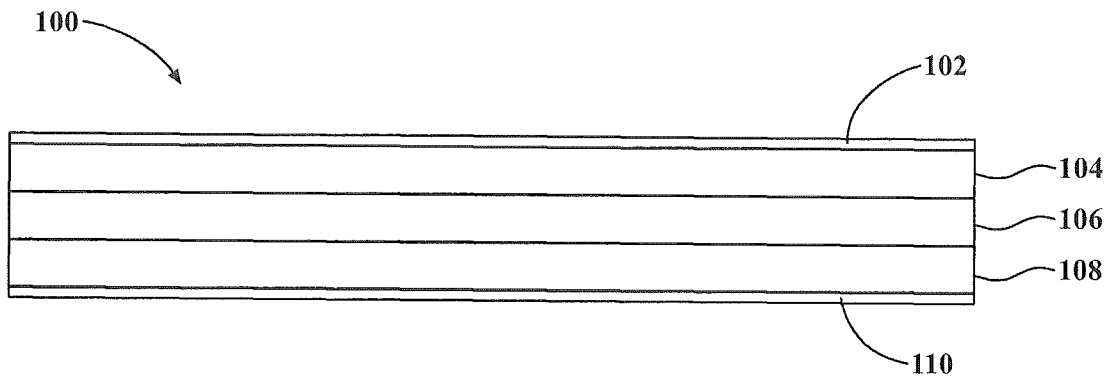
FIG. 1 is a cross-sectional view of an ECB, according to an embodiment of the present disclosure.
Figure 2:
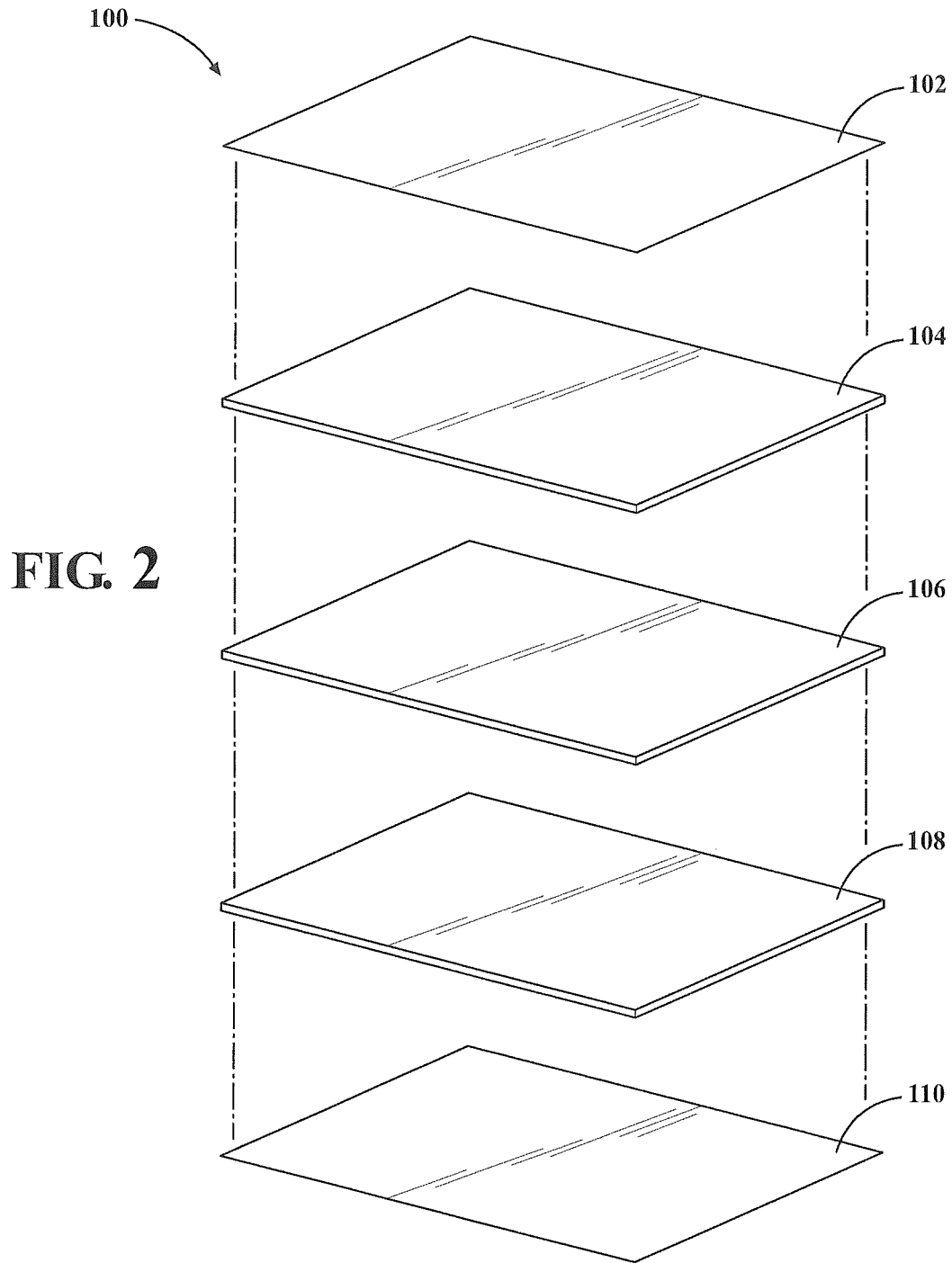
FIG. 2 is an exploded view of different layers of the ECB of FIG. 1.

FIG. 1 illustrates an embodiment of an ECB generally shown at 100. The ECB 100 includes a first conductive layer 102, a first bonding layer 104, a heat insulating layer 106, a second bonding layer 108, and a second conductive layer 110. As illustrated in FIG. 2, each of the layers 102, 104, 106, 108, and 110 has a first surface and a second surface. In the example of FIG. 2, the first surface is a top surface and the second surface is a bottom surface. The top surface of the first bonding layer 104 is configured to securely attach to the bottom surface of the first conductive layer 102, the top surface of the heat insulating layer 106 is configured to securely attach to the bottom surface the first bonding layer 104, the top surface of the second bonding layer 108 is configured to securely attach to the bottom surface of the heat insulating layer 106, and the top surface of the second conductive layer 110 is configured to securely attach to the bottom surface of the second bonding layer 108.

Each of the first and second conductive layers 102 and 110 conduct electricity between the electrical elements and circuits mounted on the respective conductive layers of the ECB 100. The first and second conductive layers 102 and 110 are made of materials for conducting electricity. The conductive layers 102 and 110 may be made of metal. For example, the conductive layers 102 and 110 may be copper foils, such as Insulectro™ type H1.

The first and second bonding layers 104 and 108 and the heat insulating layer 106 are interlayers between the conductive layers 102 and 110. The term interlayer, or substrate layer, refers to the one or more dielectric layers placed between two conductive layers 102 and 110. An interlayer may include one or more bonding layers, one or more heat insulating layers, or a combination thereof. In the example of FIG. 1, the first bonding layer 104 bonds the first conductive layer 102 and the heat insulating layer 106, and the second bonding layer 108 bonds the heat insulating layer 106 and the second conductive layer 110.

Figure 3:
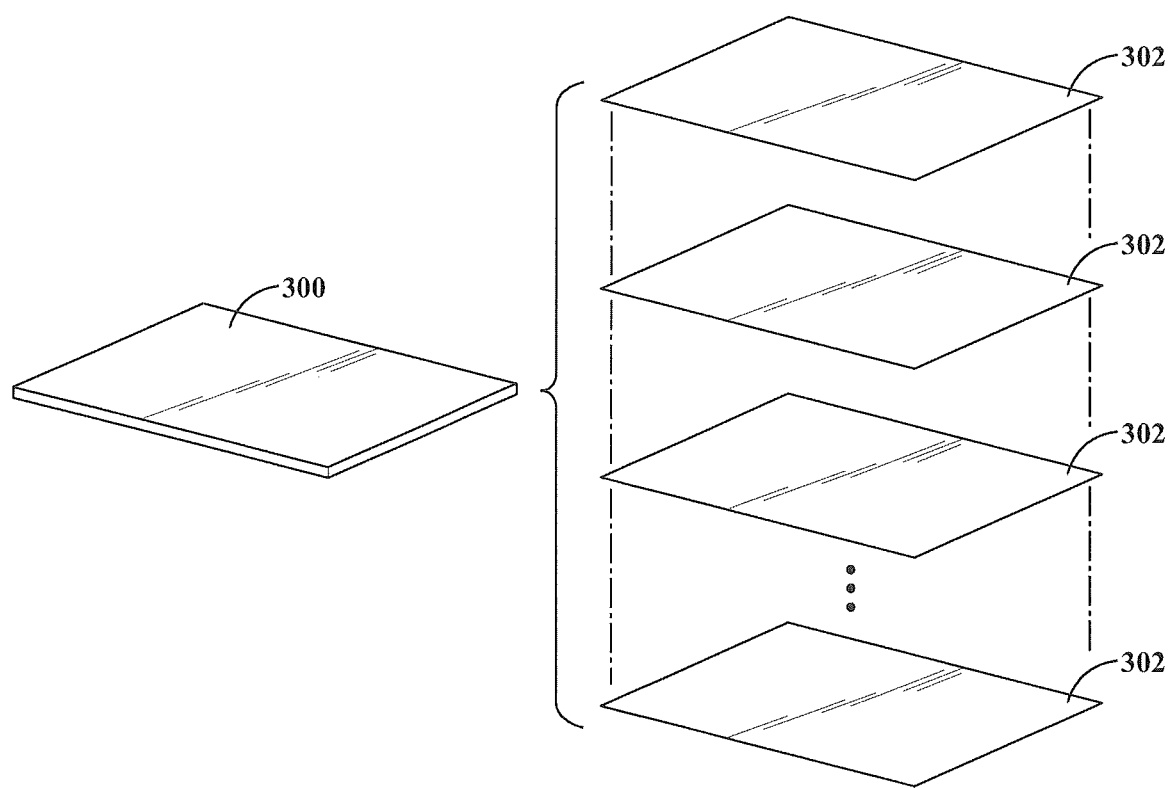
FIG. 3 is an exploded view of different sheets of materials for laminating as a bonding layer of the ECB in FIGS. 1 and 2.

As illustrated in FIG. 3, a bonding layer 300, such as each of the first and second bonding layers 104 and 108, is made from a plurality of sheets of bonding materials 302. The bonding layer 300 is made of bonding materials that can sustain a cure temperature and pressure of a laminating process. For example, the bonding layer 300 does not melt at the cure temperature. Materials suitable for FR1 to FR4 composite materials may be used as the bonding materials. For example, the bonding layer 300 may be made of a plurality of sheets of fiberglass, pre-impregnated with epoxy resin, also known as prepreg. The bonding layer 300 may be made of Insulectro™ 106NF prepreg. In an example, the bonding layer 300 is made of a plurality of sheets of Insulectro™ 106NF prepreg.

The heat insulating layer 106 includes thermal barriers. The heat insulating layer 106 reduces heat transfer from the electrical elements or circuits on a conductive layer to the opposite conductive layer of an ECB, for example, from conductive layer 102 to the conductive layer 110, or vice versa. The heat insulating layer 106 may be made of any heat resistant material as a thermal barrier. If the heat insulating layer 106 is laminated with the other bonding layers 104 and 108, the heat resistant materials of the heat insulating layer 106 must also withstand the cure temperature and pressure required by the bonding layers 104 and 108 during the laminating process. The heat resistant materials include, but are not limited to, natural fiber insulators, cotton, and wool. The heat insulating layer 106 may be made of Nomex® woven fabric, tight weave. In an example, the heat insulating layer 106 contains one sheet of 1-5 oz./yd² Nomex® woven fabric, tight weave.

The layers 102, 104, 106, 108 and 110 may be bonded together as the ECB 100 by a laminating process. In some examples, the layers 102, 104, 106, 108 and 110 are stacked together from the top to the bottom, aligned with each other as illustrated in FIG. 2, and placed on a heated press. Sufficient pressure, such as 50 tons of pressure for an area of 18"×24", is applied to the stack of layers 102, 104, 106, 108 and 110 to reach a desired thickness of the ECB 100, such as 1.2 mm. The laminating process may be conducted under a vacuum condition using a cure temperature that the bonding materials and the insulating materials can withstand. In an example where the bonding layers 104 and 108 are Insulectro™ 106 NF prepreg and the heat insulating layer 106 is the Nomex® woven fabric, tight weave, the cure temperature is 360° F. Generally, a cure temperature is recommended by the manufacturer of the relevant materials used in the bonding layers 104 and 108 or in the heat insulating layer 106. The cure temperature may be varied for other types of bonding materials, such as other prepregs. The laminated ECB 100 is cured for a period, for example, 70 minutes, as recommended by the manufacturer of the relevant materials used in the bonding layers 104 and 108 or in the heat insulating layer 106. In some examples, the entire laminating process is controlled by a bonding press computer. The computer controls the process of heating the stacked layers, the point at which to apply pressure, and when to allow the stack to cool at a controlled rate.

By inclusion of the heat insulating layer 106 in the ECB 100 as a thermal barrier, the thermal conductivity of the ECB 100 is lower than typical FR4 ECB, and thus the heat insulating layer 106 reduces the thermal conductivity of the ECB 100 and may improve the performance of heat sensitive electrical elements and circuits mounted on one conductive layer of the ECB 100.

Figure 4:
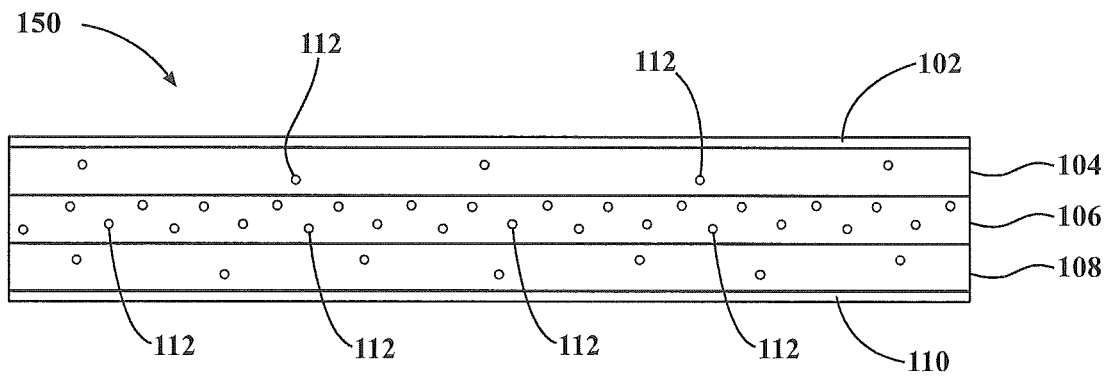
FIG. 4 is a cross-sectional view of an ECB according to another embodiment of the present disclosure.

FIG. 4 illustrates another embodiment of ECB 150. As with the ECB 100, the ECB 150 includes a first conductive layer 102, a first bonding layer 104, a heat insulating layer 106, a second bonding layer 108, and a second conductive layer 110. In addition, in ECB 150, each of the first bonding layer 104, the heat insulating layer 106, and the second bonding layer 108 contains a plurality of air bubbles 112. In some examples, as illustrated in FIG. 4, the heat insulating layer 106 contains more air bubbles than the bonding layers 104 and 108. In some examples, the air bubbles 112 are microbubbles, the diameters of which may be in an order of mm or μm.

The ECB 150 is made from the same laminating process as the ECB 100 except that the stack of the layers 102, 104, 106, 108 and 110 are laminated under atmospheric pressure, rather than under a vacuum condition. The laminating process under atmospheric pressure generates air bubbles 112 in the bonding layers 104 and 108 and in the heat insulating layer 106, while the ECB 100 laminated under a vacuum condition is air bubble free.

With the presence of air bubbles 112, the thermal conductivity of the ECB 150 is further improved over ECB 100. Air acts as a heat insulator, and the air bubbles 112 presented in the bonding layers 104 and 108 and the heat insulating layer 106 in ECB 150 serve as additional thermal barriers. As such, the ECB 150 has an improved heat insulating performance over the ECB 100.

In some examples, the heat insulating layer 106 in ECB 150 may be omitted. In this case, the ECB 150 includes the conductive layers 102 and 110, and at least one bonding layer 104 or 108. By laminating the layers 102, the at least one bonding layer 104 and 108, and 110 under atmospheric pressure, air bubbles 112 are generated in the at least one bonding layer 104 and 108 as thermal barriers. As such, the ECB 150 still has a lower thermal conductivity than a typical FR4 ECB.

Figure 5:
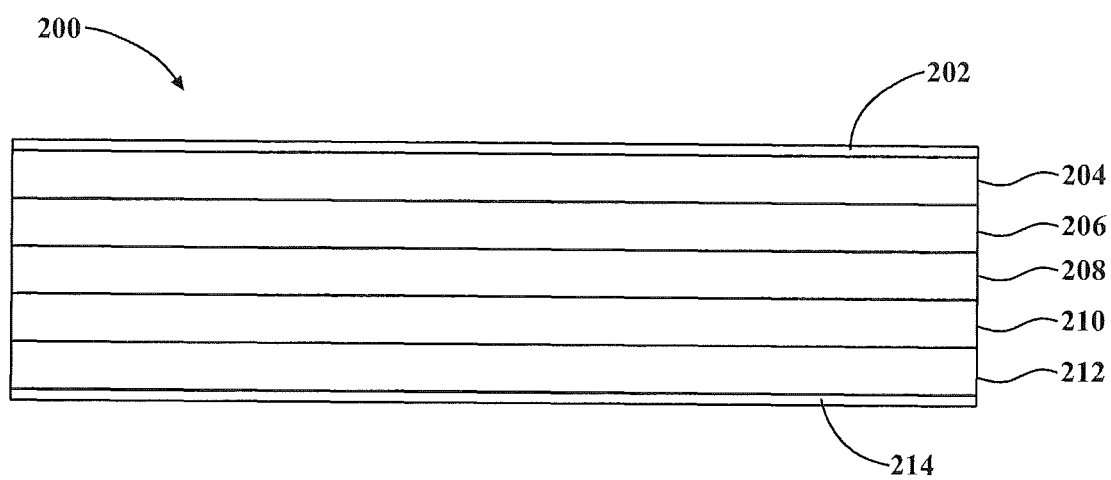
FIG. 5 is a cross-sectional view of an ECB according to another embodiment of the present disclosure.

An ECB may include more than one insulating layer to further reduce the thermal conductivity. In this regard, FIG. 5 illustrates another embodiment of an ECB 200 that includes two insulating layers. In the example of FIG. 5, ECB 200 includes a first conductive layer 202, a first bonding layer 204, a first heat insulating layer 206, a second bonding layer 208, a second heat insulating layer 210, a third bonding layer 212, and a second conductive layer 214. In the example of FIG. 5, the first bonding layer 204 bonds the first conductive layer 202 and the first heat insulating layer 206, the second bonding layer 208 bonds the first heat insulating layer 206 and the second heat insulating layer 210 and the third bonding layer 212 bonds the second heat insulating layer 210 and the second conductive layer 214.

Figure 6:
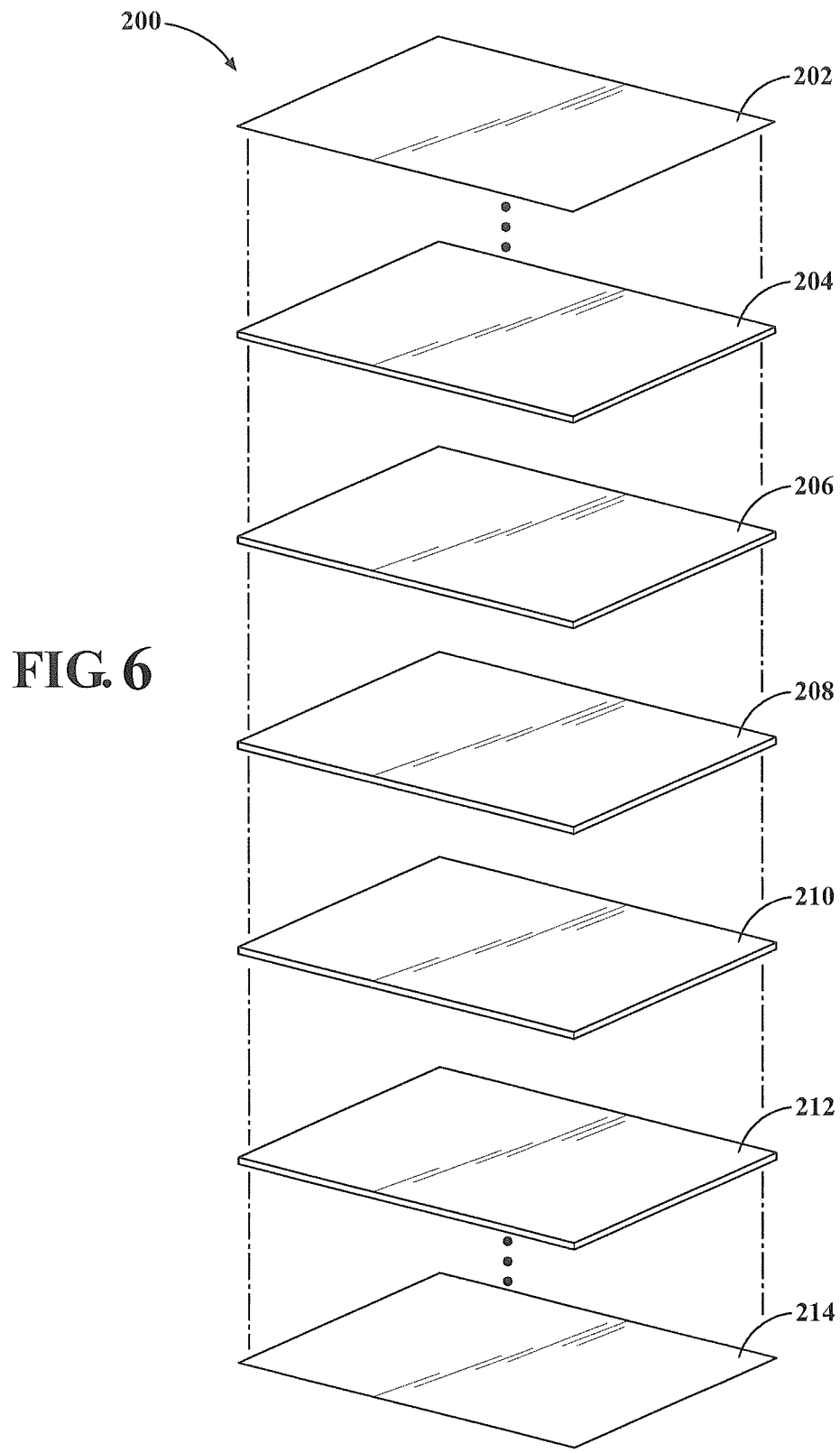
FIG. 6 is an exploded view of different layers of the ECB of FIG. 5.

As illustrated in FIG. 6, each of the layers 202, 204, 206, 208, 210, 212 and 214 has a first surface and a second surface. In the example of FIG. 6, the first surface is a top surface and the second surface is a bottom surface. The top surface of the first bonding layer 204 is configured to securely attach to the bottom surface of the first conductive layer 202, the top surface of the first heat insulating layer 206 is configured to securely attach to the bottom surface the first bonding layer 204, the top surface of the a second bonding layer 208 is configured to securely attach to the bottom surface of the first heat insulating layer 206, the top surface of the second heat insulating layer 210 is configured to securely attach to the bottom surface of the second bonding layer 208, the top surface of the third bonding layer 212 is configured to securely attach to the bottom surface of the second heat insulating layer 210, and the top surface of the second conductive layer 214 is configured to securely attach to the bottom surface the third bonding layer 212.

The first and second conductive layers 202 and 214 are the same as the conductive layers 102 and 110 described above. The first, second and third bonding layers 204, 208, and 212 are the same as the bonding layers 104 and 108 described above. The first and second insulating layers 206 and 210 are the same as the heat insulating layer 106 described above.

ECB 200 is different from ECB 100 in that ECB 200 includes one additional bonding layer and one additional insulation layer between a conductive layer and a bonding layer. For example, the first bonding layer 204 and the first heat insulating layer 206 are added between the first conductive layer 202 and the second bonding layer 208. Alternatively, ECB 200 includes one additional insulating layer and one additional bonding layer between a bonding layer and an insulating layer. For example, the second bonding layer 208 and the second heat insulating layer 210 are added between the first insulating layer 206 and the third bonding layer 212. An ECB may include two or more additional bonding layers and insulation layers between a conductive layer and a bonding layer of ECB 100, or between a bonding layer and an insulating layer of ECB 100.

The bonding layers 204, 208, and 212 may include various sheets of bonding materials. In an embodiment of the ECB 200, the first conductive layer 202 is an Insulectro™ type H1 copper foil; the first bonding layer 204 includes 5 sheets of Insulectro™ 106NF prepreg; the first heat insulating layer 206 includes 1 sheet of 1-5 oz./yd² Nomex® woven fabric, tight weave; the second bonding layer 208 includes 8 sheets of Insulectro™ 106NF prepreg; the second heat insulating layer 210 includes 1 sheet of 1-5 oz./yd² Nomex® woven fabric, tight weave; the third bonding layer 212 includes 5 sheets of Insulectro™ 106NF prepreg; and the second conductive layer 214 is an Insulectro™ type H1 copper foil.

In another embodiment of the ECB 200, the first conductive layer 202 is an Insulectro™ type H1 copper foil; the first bonding layer 204 includes 3 sheets of Insulectro™ 106NF prepreg; the first heat insulating layer 206 includes 1 sheet of 1-5 oz./yd² Nomex® woven fabric, tight weave; the second bonding layer 208 includes 12 sheets of Insulectro™ 106NF prepreg; the second heat insulating layer 210 includes 1 sheet of 1-5 oz./yd² Nomex® woven fabric, tight weave; the third bonding layer 212 includes 3 sheets of Insulectro™ 106NF prepreg; and the second conductive layer 214 is an Insulectro™ type H1 copper foil.

The layers 202, 204, 206, 208, 210, 212 and 214 may be bonded together as an ECB 200 by a laminating process. In some examples, the layers 202, 204, 206, 208, 210, 212 and 214 are stacked from the top to the bottom as described above and as shown in FIG. 6, and placed on a heated press. The same laminating process described above under a vacuum condition with respect to the ECB 100 is applied to the stacked layers. By introducing the insulating layers 206 and 210 into the ECB 200 as thermal barriers, the thermal conductivity of the ECB 200 is lower than a typical FR4 ECB. Therefore, the insulating layers 206 and 210 may improve the performance of heat sensitive electrical elements and circuits mounted on the ECB 200. As well, thermal conductivity may be further reduced in ECB 200 over ECB 100 since one additional heat insulating layer or thermal barrier is used in ECB 200.

Figure 7:
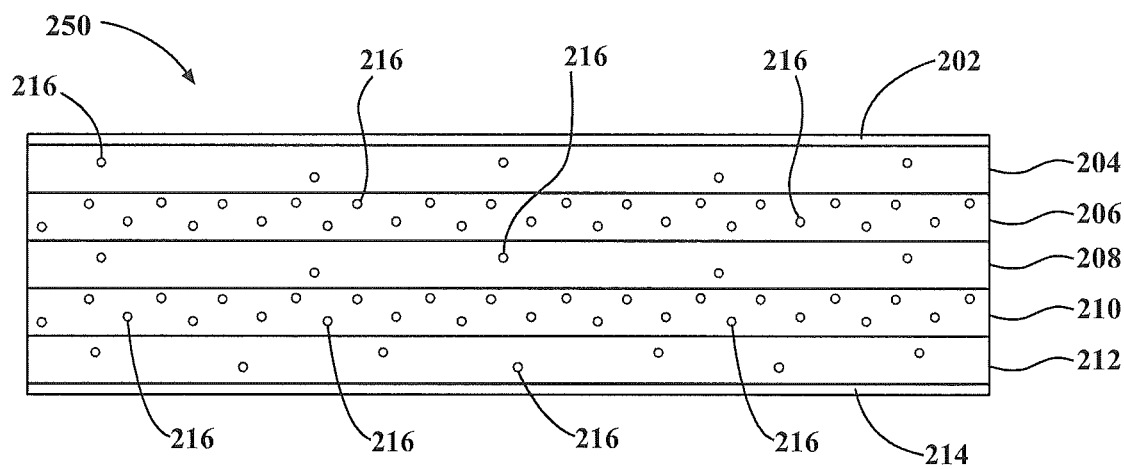
FIG. 7 is a cross-sectional view of an ECB according to another embodiment of the present disclosure.

FIG. 7 illustrates another embodiment of an ECB 250. As with the ECB 200, the ECB 250 includes a first conductive layer 202, a first bonding layer 204, a first heat insulating layer 206, a second bonding layer 208, a second heat insulating layer 210, a third bonding layer 212, and a second conductive layer 214. In addition, in ECB 250, each of the first bonding layer 204, the first heat insulating layer 206, the second bonding layer 208, the second heat insulating layer 210, and the third bonding layer 212 contains a plurality of air bubbles 216. In some examples, as illustrated in FIG. 7, each of the insulating layers 206 and 210 contains more air bubbles than each of the bonding layers 204, 208 and 212. In some examples, the air bubbles 216 are microbubbles, the diameters of which may be in an order of mm or µm.

The layers 202, 204, 206, 208, 210, 212 and 214 may be bonded together as the ECB 250 from the same laminating process described above with respect to the ECB 200 except that the stack of layers 202, 204, 206, 208, 210, 212 and 214 are laminated under atmospheric pressure, rather than under a vacuum condition. The laminating process under atmospheric pressure generates air bubbles 216 in the bonding layers 204, 208 and 212, and in the insulating layers 206 and 210, while the ECB 200 laminated under a vacuum condition is air bubble free.

With the air bubbles 216, the thermal conductivity of the ECB 250 is further improved over ECB 200. The air bubbles 216 in each of the insulating layers 206 and 210 and the bonding layers 204, 208 and 212 in ECB 250 serve as additional thermal barriers. As such, the ECB 250 has an improved heat insulating performance over ECB 200. In some examples, the ECB 250 achieves a thermal conductivity value of 0.09-0.2 W/mK.

In some examples, the insulating layers 206 and 210 in ECB 250 may be omitted. In this case, the ECB 250 includes the conductive layers 202 and 214, and at least one bonding layer 204, 208 or 212. By laminating the layers 202, at least one bonding layer 204, 208 and 212, and 214 under atmospheric pressure, air bubbles 216 are generated in the at least one bonding layer 204, 208 and 212 as thermal barriers. As such, the ECB 250 still has a lower thermal conductivity than a typical FR4 ECB.

As well, the ECB 200 or 250 exhibits mechanical properties permitting it to be easily machined, maintains sufficient mechanical resistance to thermal shocks, and offers satisfactory thermal isolation from one conductive layer of the ECB 200 or 250 to the opposite conductive layer.

Typically, the thermal conductivity value of the ECB varies inversely with the number of bonding layers and the number of insulating layers that are included in the ECB. The ECB may be thicker than the embodiments described above. For example, the ECB 100, 150, 200 or 250 may include more insulating layers and bonding layers, resulting in an ECB with a thickness of 2.5 mm with a lower thermal connectivity value, for example, 0.05-0.2 W/mK. The number of sheets of the material forming the bonding layer 104, 108, 204, 208 or 212 may be varied, as long as the bonding layer securely attaches to the heat insulating layer 106, 206 or 210 and/or to the conductive layer 102, 110, 202 or 214. If the number of the sheets of bonding materials used in forming a bonding layer increases, the mechanical strength of the ECB may be improved.

Embodiments of ECB 100, 150, 200 and 250 can be used on various electrical applications, for example, on a cooling or heating circuit of a vehicle seat.

Alternatively, embodiments of ECB 100, 150, 200 and 250 can be used in conjunction with flexible printed circuits on which conductive traces are bonded on a flexible dielectric substrate. For example, a flexible printed circuit may be securely attached to a side of the ECB 100, 150, 200 and 250, and the conductive traces of the flexible printed circuit may form a conductive layer of ECB 100, 150, 200, and 250. In these electrical applications, ECB 100, 150, 200 and 250 may be constructed with two, one, or zero conductive layers 102, 110, 202 or 214. When used with flexible printed circuits, ECB 100, 150, 200 and 250 can serve the purpose of locally rigidizing a flexible circuit in a given area while thermally isolating each side of the ECB. ECB 100, 150, 200 and 250 constructed with two, one, or zero conductive layers 102, 110, 202 or 214 can also be used on a cooling or heating circuit of a vehicle seat.

Figure 8:
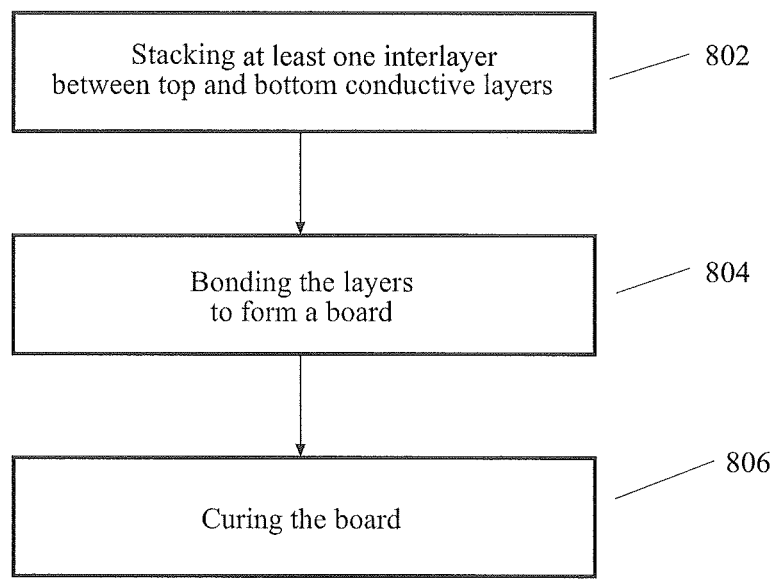
FIG. 8 is a flow chart illustrating a process of constructing an ECB, according to an embodiment of the present disclosure.

FIG. 8 illustrates an exemplary process for constructing an ECB. At least one interlayer, such as layer 104, 106, or 108 in the examples of FIGS. 1-2 and 4, or layer 204, 206, 208, 210, or 212 in the examples of FIGS. 5-7, is selected and stacked between the two conductive layers on a heated press, such as layer 102 and 110 or layers 202 and 214 in FIGS. 5-7 (step 802). The interlayer may include at least one sheet of relevant materials, such as bonding materials or heat insulating materials as described above. The conductive layers and the at least one interlayer are arranged in an order so that both surfaces of the at least one interlayer are bonded with a respective conductive layer. For example, the layers are placed in a heated press in an order as described in the laminating processes for ECB 100, ECB 150, ECB 200, and ECB 250.

The stacked layers are then bonded to construct an ECB, such as ECB 100, ECB 150, ECB 200, or ECB 250, by applying a laminating process (step 804). For example, as described above in the laminating processes for ECB 100, ECB 150, ECB 200, and ECB 250, at a cure temperature that the bonding layer and or the heat insulating layer can withstand without melting, sufficient pressure is applied to the loose stacked layers until a desired thickness of the ECB is reached, such as 0.6 mm-2.5 mm.

In some examples, the interlayer includes at least one of a heat insulating layer and a bonding layer, and the laminating process is conducted on the stacked layers under a vacuum condition. In this case, no air bubbles are generated in the interlayer, as described in the laminating process of ECB 100 and 200.

In some examples, the interlayer includes at least one of a heat insulating layer and a bonding layer, and the laminating process is conducted on the stacked layers under an atmospheric pressure. In this case, air bubbles, such as air bubbles 112 in ECB 150 or air bubbles 216 in ECB 250, are generated in the interlayer as an additional thermal barrier, for example, as described in the laminating process of ECB 150 and 250.

The laminated ECB is cured for a period (step 806), for example, 70 minutes. The cure period of the ECB varies based on the interlayer materials used and generally is recommended by the manufacturer of the interlayer materials. The cured ECB may be further polished.

The invention has been described in an illustrative manner, and it is to be understood that the terminology which has been used is intended to be in the nature of words of description rather than of limitation. Many modifications and variations of the present invention are possible in light of the above teachings. It is, therefore, to be understood that within the scope of the appended claims, the invention may be practiced other than as specifically described.

The invention claimed is:

1. An electrical circuit board, comprising:
   a first conductive layer and a second conductive layer;
   an interlayer as a thermal barrier, placed between the first conductive layer and the second conductive layer, wherein the thermal barrier reduces heat transfer between the first conductive layer and the second conductive layer, wherein the interlayer is a first heat insulating layer;
   a second heat insulating layer;
   a first bonding layer bonding the second heat insulating layer with the first heat insulating layer;
   a second bonding layer bonding the first heat insulating layer with the second conductive layer; and
   a third bonding layer bonding the first heat insulating layer with the first conductive layer; wherein
   the first conductive layer is an Insulectro™ type H1 copper foil;
   the first bonding layer includes five sheets of Insulectro™ 106NF prepreg;
   the first heat insulating layer includes one sheet of 1-5 oz./yd² Nomex® woven fabric, tight weave;
   the second bonding layer includes eight sheets of Insulectro™ 106NF prepreg;
   the second heat insulating layer includes one sheet of 1-5 oz./yd² Nomex® woven fabric, tight weave;
   the third bonding layer includes five sheets of Insulectro™ 106NF prepreg; and
   the second conductive layer is an Insulectro™ type H1 copper foil.

2. The electrical circuit board of claim 1, wherein the thermal barrier includes a plurality of air bubbles within the interlayer.

3. The electrical circuit board of claim 1, wherein at least one of the first and second heat insulating layer is made of heat resistant material.

4. The electrical circuit board of claim 3, wherein the heat resistant material is Nomex® woven fabric, tight weave.

5. The electrical circuit board of claim 4, wherein the heat resistant material is one sheet of 1-5 oz./yd² Nomex® woven fabric, tight weave.

6. The electrical circuit board of claim 1, further comprising at least one bonding layer for securely attaching the first heat insulating layer to at least one of the first and second conductive layers.

7. The electrical circuit board of claim 6, further comprising a plurality of air bubbles within the at least one bonding layer.

8. The electrical circuit board of claim 6, wherein the at least one bonding layer is made from a plurality of sheets of bonding materials.

9. The electrical circuit board of claim 6, wherein the at least one bonding layer is made from a plurality of sheets of prepreg.

10. The electrical circuit board of claim 6, wherein the at least one bonding layer is made from a plurality of sheets of Insulectro™ 106NF prepreg.

11. The electrical circuit board of claim 1, wherein the first and second conductive layers are copper foils.

12. The electrical circuit board of claim 1, wherein:
the first conductive layer is an Insulectro™ type H1 copper foil;
the first bonding layer includes three sheets of Insulectro™ 106NF prepreg;
the first heat insulating layer includes one sheet of 1-5 oz./yd² Nomex® woven fabric, tight weave;
the second bonding layer includes 12 sheets of Insulectro™ 106NF prepreg;
the second heat insulating layer includes one sheet of 1-5 oz./yd² Nomex® woven fabric, tight weave;
the third bonding layer includes three sheets of Insulectro™ 106NF prepreg; and
the second conductive layer is an Insulectro™ type H1 copper foil.

13. The electrical circuit board of claim 1, further comprising a plurality of air bubbles within one or more of the first bonding layer, the first heat insulating layer, the second bonding layer, the second heat insulating layer, and the third bonding layer.

14. The electrical circuit board of claim 13, wherein the electrical circuit board is used in a cooling or heating circuit for a vehicle seat.

15. The electrical circuit board of claim 13, further comprising a flexible printed circuit securely attached to a side of the electrical circuit board.

16. The electrical circuit board of claim 15, wherein the electrical circuit board locally rigidizes the flexible printed circuit in an area and thermally isolates each side of the electrical circuit board.

17. The electrical circuit board of claim 15, wherein the conductive traces of the flexible printed circuit forms a conductive layer of the electrical circuit board.

\* \* \* \* \*